(12) United States Patent
Wang et al.

(10) Patent No.: US 6,292,116 B1
(45) Date of Patent: Sep. 18, 2001

(54) TECHNIQUES AND CIRCUITRY FOR ACCURATELY SAMPLING HIGH FREQUENCY DATA SIGNALS INPUT TO AN INTEGRATED CIRCUIT

(75) Inventors: Bonnie I. Wang, Cupertino; Chiakang Sung, Milpitas; In Whan Kim, Santa Clara; Wayne Yeung, San Francisco; Xiaobao Wang, Santa Clara; Khai Nguyen; Joseph Huang, both of San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/571,766

(22) Filed: May 16, 2000

Related U.S. Application Data

(60) Provisional application No. 60/134,437, filed on May 17, 1999.

(51) Int. Cl.[7] ............................................ H03M 9/00
(52) U.S. Cl. ................................. 341/100; 375/376
(58) Field of Search .................................. 341/100, 101; 375/376

(56) References Cited

U.S. PATENT DOCUMENTS

| | | | |
|---|---|---|---|
| 5,155,486 | * 10/1992 | Murfet et al. | 341/100 |
| 5,541,596 | * 7/1996 | Yoshida | 341/100 |
| 5,587,709 | * 12/1996 | Jeong | 341/100 |
| 5,648,776 | * 7/1997 | Widmer | 341/100 |
| 5,714,904 | 2/1998 | Jeong . | |
| 5,987,543 | 11/1999 | Smith . | |
| 6,026,134 | * 2/2000 | Duffy et al. | 375/376 |
| 6,222,380 | * 4/2001 | Gerowitz et al. | 326/38 |

* cited by examiner

*Primary Examiner*—Howard L. Williams
(74) *Attorney, Agent, or Firm*—Townsend and Townsend and Crew LLP

(57) ABSTRACT

Techniques and circuitry are provided to handle high frequency input data. The techniques and circuitry take a high-frequency serial input data stream and covert it into parallel form for handling within the integrated circuit. The circuitry ensures the high frequency data is strobed properly by accounting for skew between the high frequency data input and clock input. In an implementation, multiple clock strobes are generated having the same frequency but different phase. A predetermined series of bits is input to the high frequency input into the circuitry for training. One of the multiple clock strobes is selected based on which one correctly determines the bits in the predetermined input data stream. This clock strobe is selected to strobe the high frequency data input for the integrated circuit. In an embodiment, the high frequency data input is an LVDS input of a programmable logic integrated circuit.

20 Claims, 10 Drawing Sheets

TECHNIQUES AND CIRCUITRY FOR ACCURATELY SAMPLING HIGH FREQUENCY DATA SIGNALS INPUT TO AN INTEGRATED CIRCUIT

This application claims the benefit of U.S. provisional patent application 60/134,437, filed May 17, 1999, which is incorporated by reference along with all other references listed in this patent application.

BACKGROUND OF THE INVENTION

The present invention relates to the field of high-speed data input schemes for integrated circuits, and in particular to techniques and circuitry for accurately sampling high frequency input data.

In integrated circuits such a microprocessors, memories, ASICs, and programmable logic devices (PLDs), it is desirable to input data at higher speeds. This allows higher performance integrated circuits, which in turn facilitates higher speed networks, such as the internet. One high speed interface scheme, among others, is known as low voltage differential signal (LVDS). LVDS is being used or will be used with many types of integrated circuits including programmable logic integrated circuits. The LVDS interface is especially useful for interfacing with fiber optic systems. Using LVDS, the data is input serially to the integrated circuit at a rate that is typically higher than the rate at which data is input at a regular data input. For example, a typical data input to the integrated circuit runs at about 80 megahertz while the LVDS data rate may be 8 times that rate.

In order to handle the LVDS data rate, the serial stream must be strobed at the appropriate times in order to correctly determine the data bits in stream. The user provides a input clock used to strobe the LVDS data stream. However, because of the high frequency of the LVDS data rate, the "window" where the LVDS data may be successful strobed is, for example, about 1.6 nanoseconds. Therefore, any skew between the input clock and LVDS input may lead to data errors since the wrong data will be strobed into the integrated circuit. This will lead to logic failures. Misalignment of the clock and input data may be caused by one or more of the following factors: PLL jitter, internal register set-up time and hold time, clock duty cycles, clock skew, process, and temperature variations, skew from the customer board design, and other considerations Therefore, as can be appreciated, there is a need for interface circuitry and techniques for integrated circuits, especially programmable logic integrated circuits, to handle high frequency input data

SUMMARY OF THE INVENTION

The present invention provides techniques and circuitry for handling high frequency input data. The techniques and circuitry take a high-frequency serial input data stream and covert it into parallel form for handling within the integrated circuit. The circuitry ensures the high frequency data is strobed properly by accounting for skew between the high frequency data input and clock input. In an implementation, multiple clock strobes are generated having the same frequency but different phase. A predetermined series of bits is input to the high frequency input into the circuitry for training. One of the multiple clock strobes is selected based on which one correctly determines the bits in the predetermined input data stream. This clock strobe is selected to strobe the high frequency data input for the integrated circuit. In an embodiment, the high frequency data input is an LVDS input of a programmable logic integrated circuit.

In an embodiment, a phase locked loop (PLL) is designed with the ability to generate multiple clock strobes with programmable, small timing differences which is ideal for adjusting clock strobe positions. The "oversampling" technique works in the following way: By sending multiple clocks to the serial-to-parallel converter at the receiver end, if the calibration data stream pattern is known, by observing the registers of the serial-to-parallel converter, the clock strobe positions can be dynamically adjusted for a small increment of skew relatively to incoming data stream. This process can be repeated several times automatically until the correct data stream is fully captured in the serial-to-parallel converter.

In another embodiment, the invention is a programmable logic integrated circuit including a first register connected to a first input and a first clock signal. A second register is connected to the first input and a second clock signal. A multiplexer is connected to outputs of the first and second register. And, a third register is connected to an output of the multiplexer and a third clock signal, where the first and second clock signals are at a first frequency and have different phases, and the third clock signal is at a second frequency, slower than the first frequency.

In a further embodiment, the invention is an integrated circuit including a high frequency data differential input and a clock input, where a data rate at the data input is at least M times a frequency of a clock signal provided at the clock input. A differential input buffer is connected to the high frequency data input providing a single-ended data input. A clock generator circuit is connected to the clock input and generates a first fast clock signal that is at least M times the clock input. A first shift register and second shift register are connected to receive serial data from the single-ended data input, where the first and second shift registers are clocked using a clock having a frequency of the first fast clock signal at different phases. There are a plurality of multiplexers, one for each bit of the first and second shift registers. Each multiplexer is connected to one bit in the first shift register and one bit in the second shift register. A third register is connected to the multiplexers. Each shift register can hold at least M bits.

The invention includes a method of operating a programmable logic integrated circuit including inputting a predetermined stream of bits at a high frequency input and inputting a clock signal at a clock input. From the clock signal, a first and second fast clock signal are generated, each having the same frequency but different phases. The predetermined stream is loaded into a first shift register using the first fast clock signal. The predetermined stream is loaded into a second shift register using the second fast clock signal. Data is selectively passed from the first or second shift register to a third register.

Other objects, features, and advantages of the present invention will become apparent upon consideration of the following detailed description and the accompanying drawings, in which like reference designations represent like features throughout the figures.

DETAILED DESCRIPTION

Figure 1:
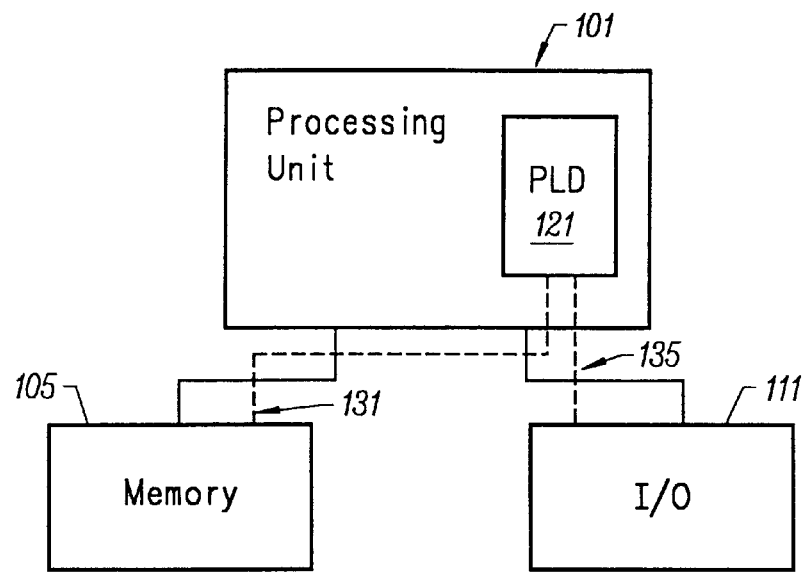
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. Pat. Nos. 4,871,930, 5,241,224, 5,258, 668, 5,260,610, 5,260,611, 5,436,575, and the *Altera Data Book* (1999), all incorporated by reference in their entirety for all purposes. Programmable logic integrated circuits and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
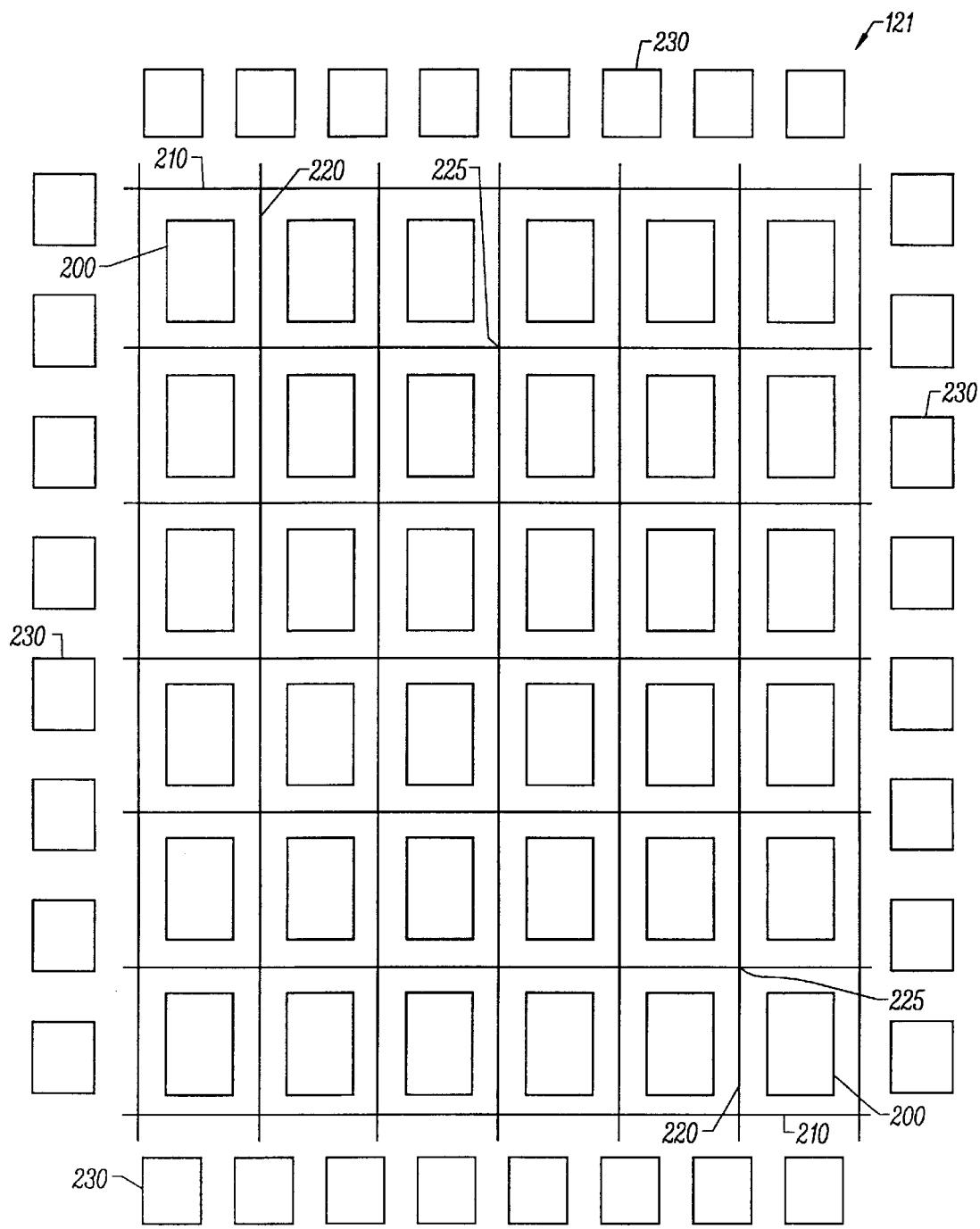
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. In other embodiments of a programmable logic integrated circuit, the input-output drivers may be embedded with the integrated circuit core itself. This embedded placement of the input-output drivers may be used with flip chip packaging and will minimize the parasitics of routing the signals to input-output drivers.

Figure 3:
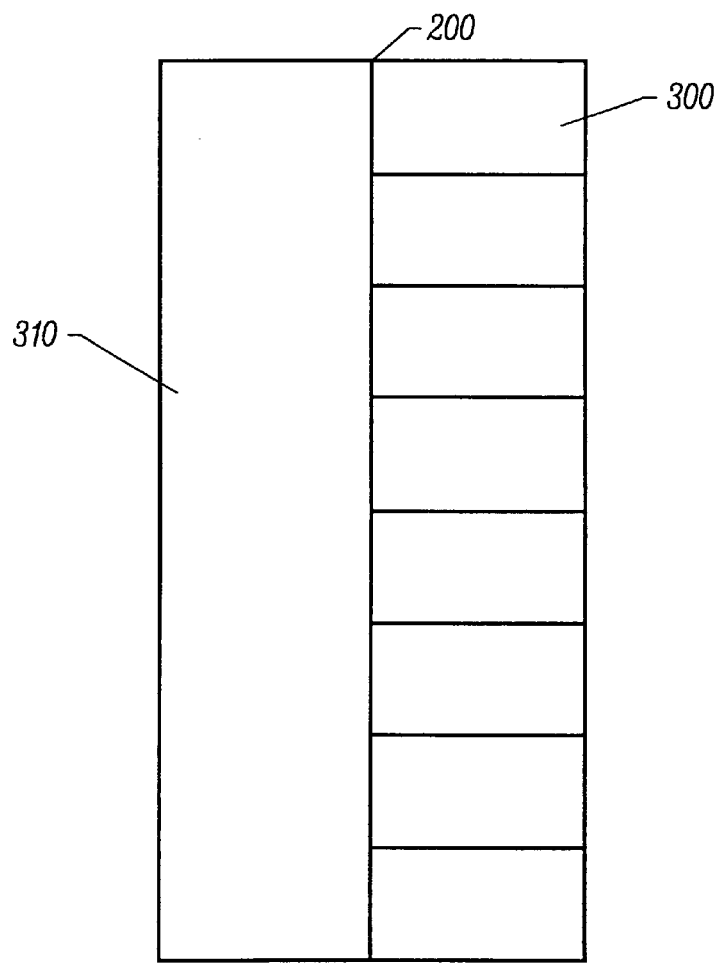
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
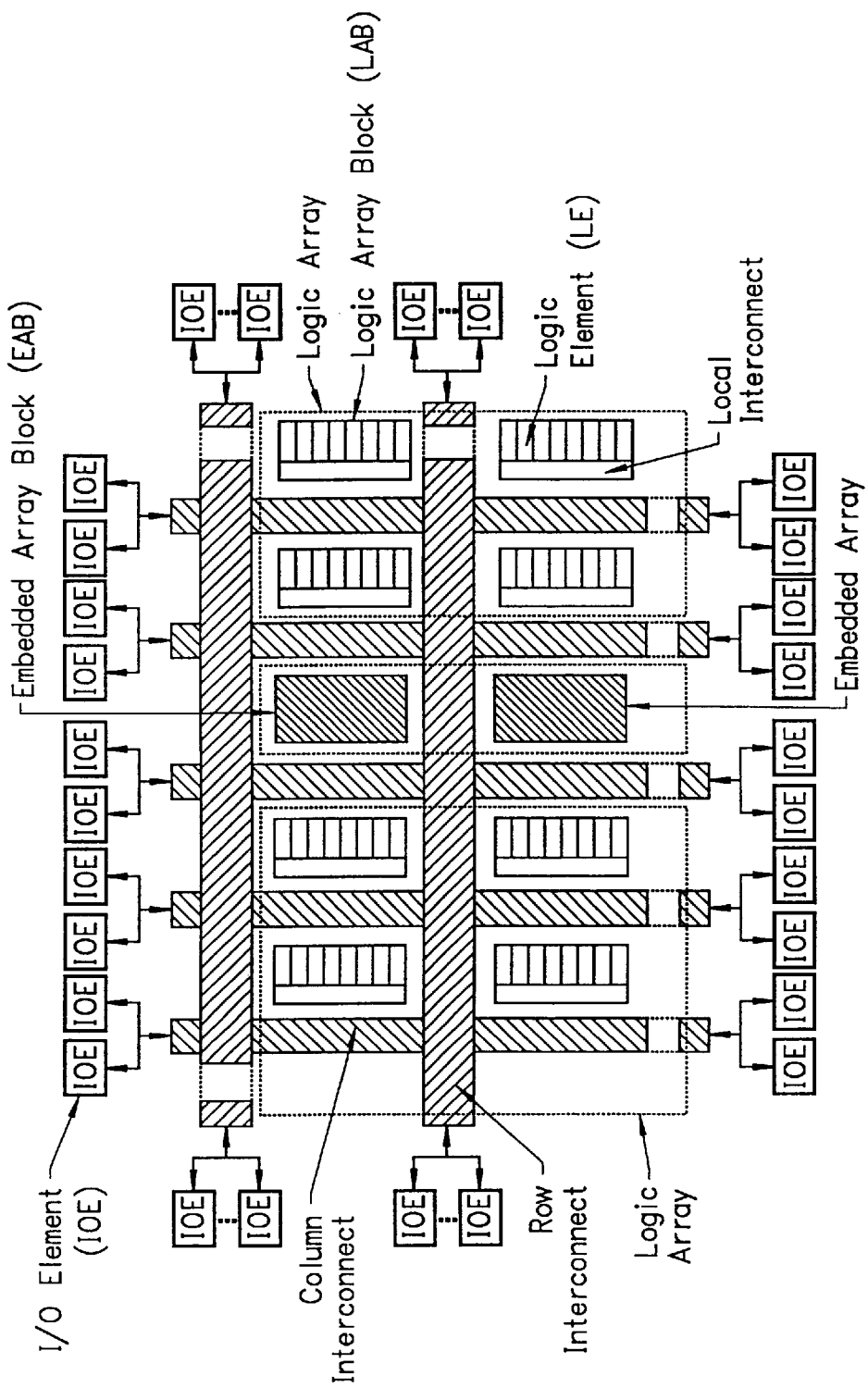
FIG. 4 shows an architecture of a programmable logic integrated circuit with embedded array blocks (EABs).

FIG. 4 shows a PLD architecture similar to that in FIG. 2. The architecture in FIG. 4 further includes embedded array blocks (EABs). EABs contain user memory, a flexible block of RAM. More discussion of this architecture may be found in the *Altera Data Book* (1999) in the description of the FLEX 10 K product family and also in U.S. Pat. No. 5,550,782, which are incorporated by reference.

Figure 5:
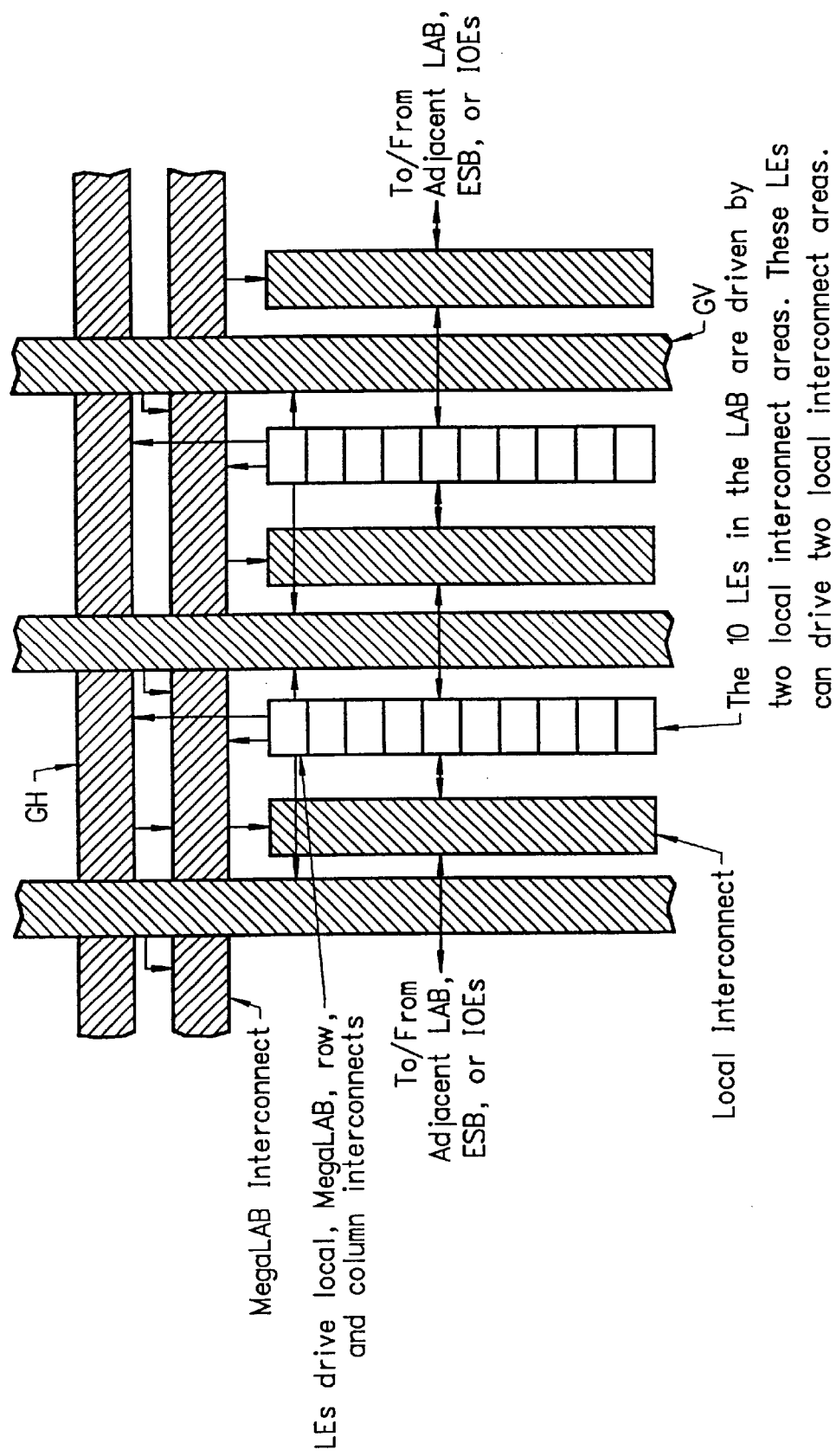
FIG. 5 shows an architecture of a programmable logic integrated circuit with megaLABs.

FIG. 5 shows a further embodiment of a programmable logic integrated circuit architecture. FIG. 5 only shows a portion of the architecture. The features shown in FIG. 5 are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the megaLAB. Compared to the architecture of FIG. 2, this architecture has an additional level of interconnect, the megaLAB interconnect. Such an architecture is found in Altera's APEX™ family of products, which is described in detail in the *APEX 20 K Programmable Logic Device Family Data Sheet* (August 1999), which is incorporated by reference. In a specific implementation, a megaLAB also includes an embedded system block (ESB) to implement a variety of memory functions such as CAM, RAM, dual-port RAM, ROM, and FIFO functions.

In a complex PLD which supports many I/O standards, it is necessary to provide special I/O interface circuits for high-speed data transfer applications. In a typical application, the data transfer rate is about 622 megahertz per channel. A preferred circuit implementation on a PLD device often requires a special designated serial-to-parallel and parallel-to-serial converters controlled by a PLL generated clock. Such an architecture allows user to run clock at a lower frequency at the pin, generate the multiplied clock (e.g., 2×, 3×, 4×, 5×, 6×, 7×, 8×, 9×, or 10×) by the on-chip PLL, and convert the data stream using the serial-to-parallel for input and parallel-to-serial for output. Typical I/O standard using this interface technique is the low voltage differential signal (LVDS). This scheme requires accurate placement of internal clock strobes at the receiver end to capture data stream at high speed. Factors affecting the clock strobe placement include: PLL jitter, internal register set-up time and hold time, clock duty cycles, clock skew, process, and temperature variations, skew from the customer board design, and other considerations.

As frequency increases, the circuit requirement for clock strobe placement becomes more stringent due to the small sampling window. It is desirable to dynamically adjust the PLL clock strobe position, which can automatically deskew and align the data stream and clock for best performance.

A PLL is designed with the ability to generate multiple clock strobes with programmable, tiny timing difference which is ideal for adjusting clock strobe positions. The "oversampling" technique works in the following way. By sending multiple clocks to the serial-to-parallel converter at the receiver end, if the calibration data stream pattern is known, by observing the registers of the serial-to-parallel converter, the clock strobe positions can be dynamically adjusted for a small increment of skew relatively to incoming data stream. This process can be repeated several times automatically until the correct data stream is fully captured in the serial-to-parallel converter. The limitation of this method is that: (a) skew between clock and data stream is a constant at any given short period time, and (b) calibration data stream needs to be applied periodically to readjust the clock strobe position should the skew between clock and data stream varies over time.

Figure 6:
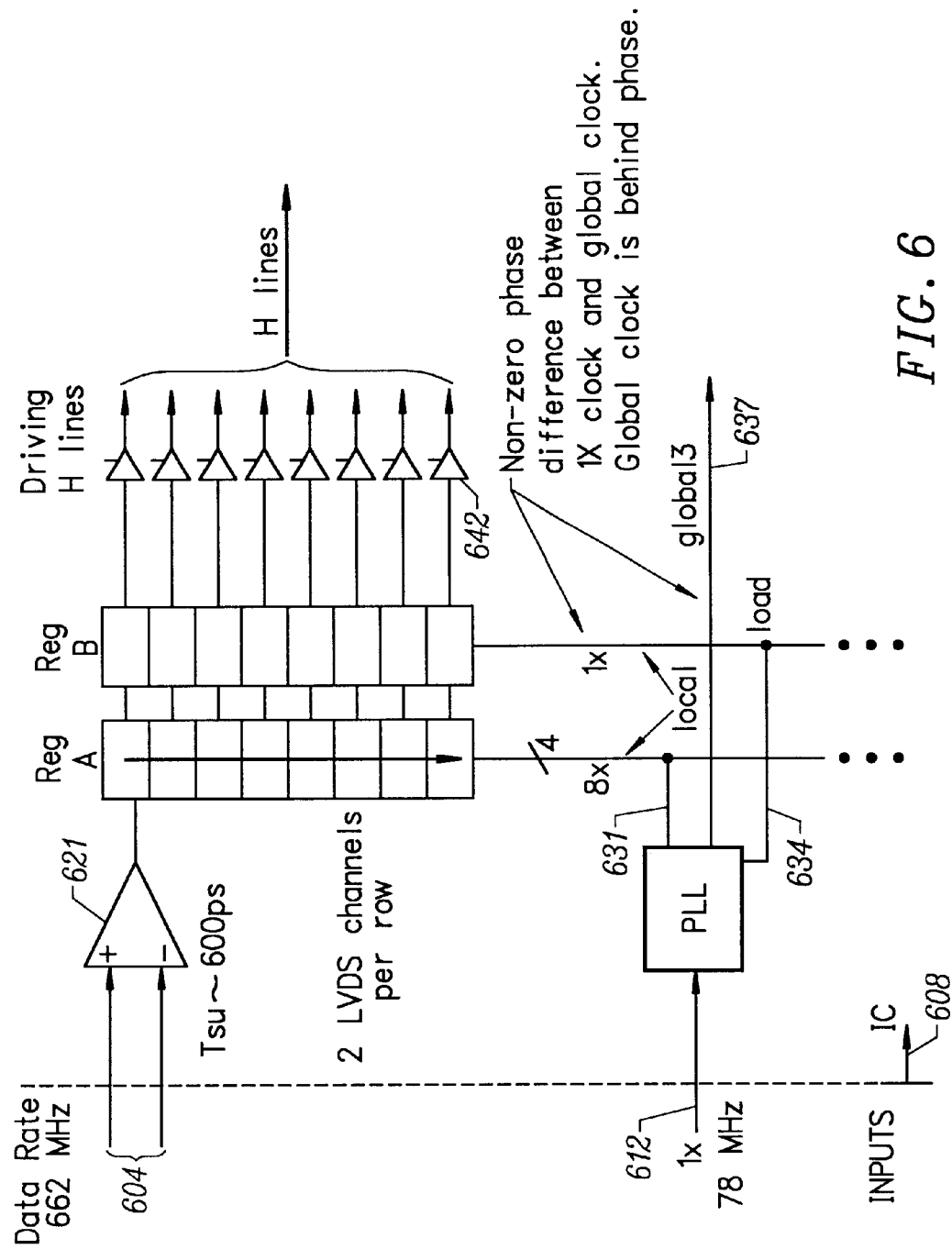
FIG. 6 shows an input interface for an integrated circuit.

FIG. 6 shows a block diagram of a low voltage differential signal (LVDS) input interface scheme of the present invention. This input interface converts from the higher frequency LVDS input to a lower internal frequency input. In brief, serial LVDS data is streamed differentially into the integrated circuit at high frequency. This data is converted into single-ended parallel data at a lower frequency. This lower frequency data will be used by the circuitry of the integrated circuit. In a programmable logic integrated circuit, there are LVDS inputs and regular data inputs. The regular data input typically run in the range from 100 to 200 megahertz. In contrast, the LVDS data input typically runs at much high frequencies, such as 622 megahertz. At 622 megahertz, the data only lasts about 1.6 nanoseconds, so it is important to catch the data correctly. In order to properly and reliably determine the data input, it is important that any clock strobe used to latch or clock in the LVDS be in about the center of the 1.6-nanosecond window in order to account for skew and other variations.

A differential signal is provided at inputs 604 to an integrated circuit 608. In a specific embodiment, the integrated circuit is a programmable logic device. This differential signal has positive (+) and negative (−) inputs and is at voltage levels conforming to an LVDS standard. For example, in a specific example, the voltage levels for a logical 1 the positive (+) input is about 100 millivolts higher than the negative (−) input. For a logical 0, the negative (−) input will be about 100 millivolts higher than the positive (+) input. A center voltage between the positive and negative inputs will be in a range from about 1.125 volts to about 1.375 volts. The voltages given are relative to a ground voltage or VSS of the integrated circuit. The differential inputs are used to input data into the integrated circuit. This input data is in the form of a string of serial bits.

LVDS input signals facilitate high speed data transfer for a number of reasons. One reason is that a 100 millivolt signal transition takes less time, especially when compared to a typical TTL or CMOS input.

Along with the input data, an input clock 612 is input into the integrated circuit. The input clock is a 1× clock signal. In a particular embodiment, the data provided at the LVDS input is input at 8× the input clock signal. For an input clock signal of about 78 megahertz, the data rate for the LVDS input will be about 622 megahertz. The frequencies of the clock and data will vary depending on the process. For example, if the clock input is 105 megahertz, the fast data input will be about 840 megahertz. The input clock is used to deserialize the LVDS serial data for use within the integrated circuit. Although the user is supposed to line up the input clock with the LVDS data input, in real life situations, there will likely be some amount of skew between the LVDS data input and input clock. Therefore, circuitry is needed to align the clock and the LVDS data to properly deserialize the LVDS data. If there is a mismatch between the LVDS data and clock input, incorrect data will be read into the integrated circuit.

A phase locked loop (PLL) circuit receives input clock 612 and generates a first clock 631 at 8× the input clock frequency, a second clock 634 or load signal at 1×the input clock frequency, and a third clock 637 or global clock that is at 1×the input clock frequency. There will be a nonzero phase difference between the load clock 634 and global clock 637. The global clock will be behind in phase. In other words, a leading edge of the global clock will follow the leading edge of the load clock. In other embodiments, other circuits besides a PLL circuit may also be utilized to generate these clock signals. For example, a delay locked loop (DLL) may be used.

The difference in frequency between the fast or LVDS data input and the clock input can be any value M. For example, M can be an integer 2 or greater. This patent describes M as being 8 is merely an example. The fast data input will be M times faster than the clock input. In an embodiment of the invention, the user can select M by programming or configuring the PLD, such as programming SRAM cells, antifuse, registers, Flash cells, EEPROM cells, or other memory storage cells. In a specific embodiment of the invention, the user can select a data input frequency that is 4×, 7×, or 8× faster than the clock input frequency. In another embodiment, M can be programmably selected to be 2, 3, 4, 5, 6, 7, 8, 9, or 10. This allows the user greater flexibility in determining what data clock frequencies will work best in the user's system.

The circuitry in FIG. 6 deserializes the input data and provides logical signals to the circuitry of the integrated circuit. In the FIG. 6 embodiment, inputs 604 are input to a differential amplifier buffer 621. The differential amplifier buffer provides a single-ended output which is representative of a Boolean 0 or 1. In a specific embodiment, the setup time or TSU for the differential amplifier buffer is about 500 picoseconds. The LVDS data is clocked into a first set of registers, register A, using first clock signal 631, which is 8× the input clock signal. Register A is a shift register.

The data stored in register A is then input in parallel into register B using load clock 634, which is 1× the input clock signal. From register B, the data is provided to the circuitry of the integrated circuit. For example, the data from register B can be driven through drivers 642 to the GH lines of the programmable logic integrated circuit.

Figure 7:
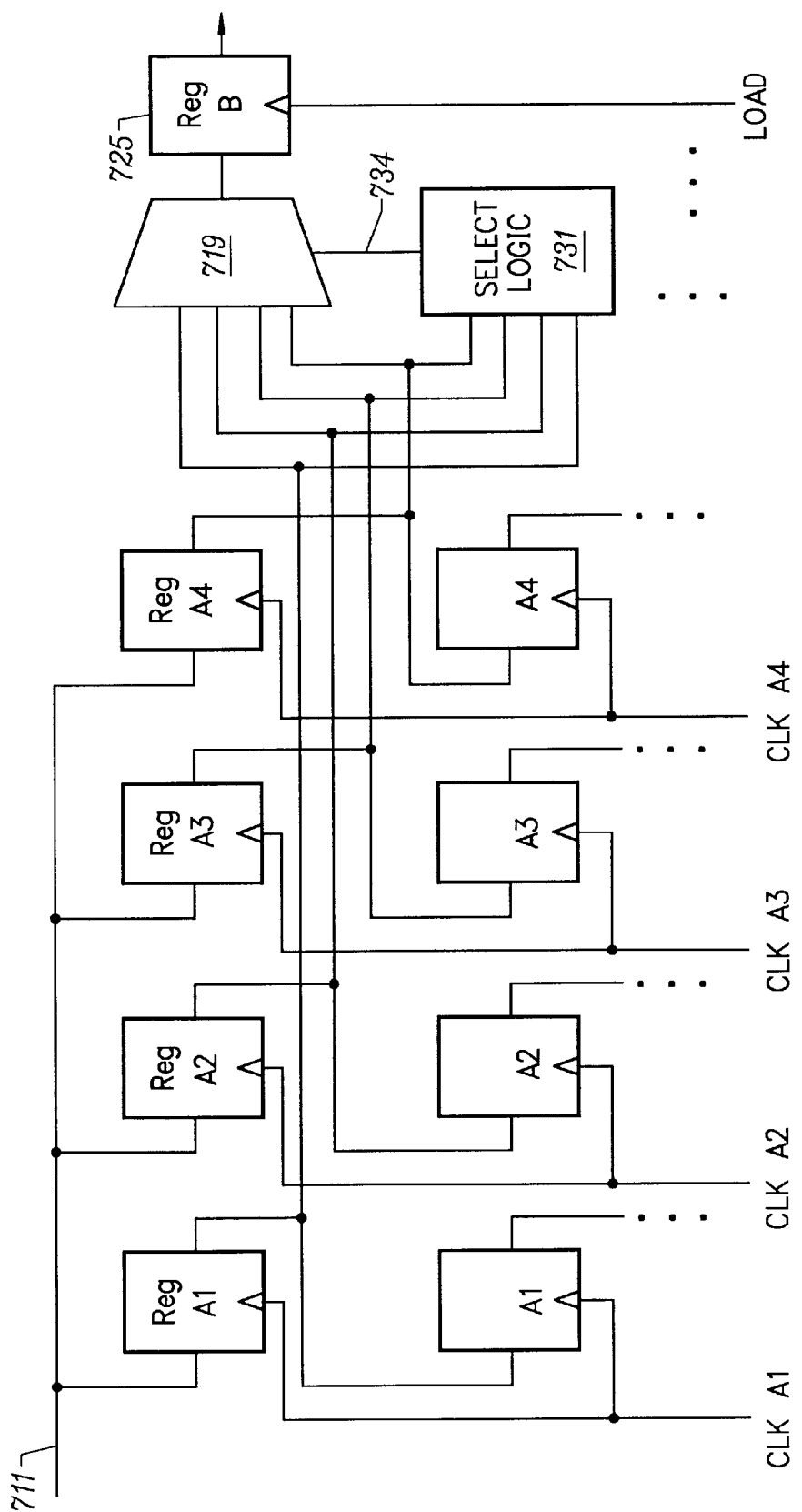
FIG. 7 shows a more detailed diagram of an input interface for deskewing data input to an integrated circuit.

FIG. 7 shows a more detailed diagram of circuitry of the present invention to deserialize the LVDS data input. This technique and circuitry oversamples with multiple clock strobes to achieve accurate data sampling of the LVDS input. This will handle skew between the LVDS data input and clock input. Specifically, shift register A of FIG. 6 is split into four separate shift registers A1, A2, A3 and A4. Input data 711 from the differential amplifier buffer is provided to each of the shift registers A1, A2, A3, and A4. Each shift register is clocked using a respective clock, clock A1, A2, A3, or A4. Clocks A1, A2, A3, and A4 are 8× the input clock 612 generated using the PLL, but each clock has a different phase.

Figure 8:
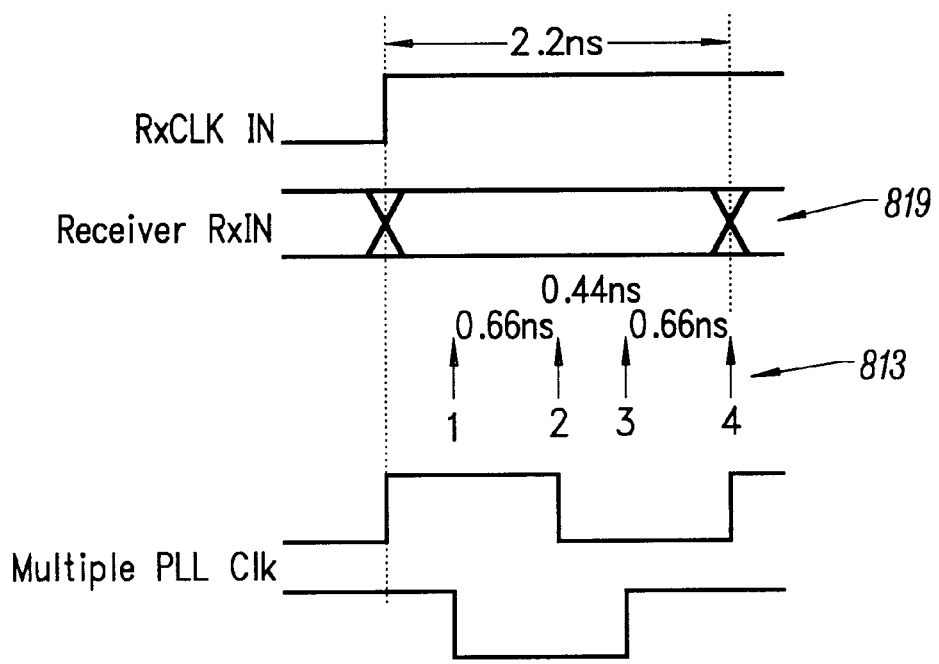
FIG. 8 shows a timing waveform for a deskewing technique using multiple clock strobes.

Each shift register will strobe and store the input data based on its respective clock. FIG. 8 show a diagram of four clock strobes 813 for the four shift registers A. These clock strobes are generated from the PLL. Some techniques for generating clock strobes having different phases will be discussed below. In particular, FIG. 8 shows the timing waveform to capture an incoming data stream of 462 megahertz. The internal PLL clock runs at 462 megahertz, or a 2.2 nanosecond period. Based on the position of a particular clock strobe, appropriate data 819 will be sampled into the shift register. The data is captured at the falling edges of the clock. Four possible strobe positions 1, 2, 3, and 4 are shown with a timing difference of 0.66 nanoseconds to 0.44 nanoseconds. In this example, three strobes (i.e., 1, 2, and 3) successfully capture the data (assuming a small setup and hold time, Tsu +Thd), while the fourth (i.e., 4) strobe misses the data.

This technique of sampling using multiple clocks can be used to compensate for skew between the input data and clock input. As shown in FIG. 7, each of the shift registers A1, A2, A3, and A4 is connected to a four-to-one multiplexer 719. Using multiplexer 719, data from one of the shift registers A is selectively connected to register B 725. The data from the selected register A is stored into register B using the load signal.

FIG. 6 gives an overall view of the input circuitry and FIG. 7 gives more specific detail. To simplify the diagram, however, FIG. 7 only shows a view of the circuitry for a single "row" of shift registers A1 to A4. There will be other rows of shift registers for the additional bits in each of the shift registers A1 to A4. Each row will be similar for the row that is shown. The row shown is the first row, so the input for registers A1 to A4 come from the differential input buffer. The data input for each succeeding row in the shift registers A1 to A4 come from the preceding row.

For an M of 8, a "frame" for the LVDS data has eight bits, which means for each pulse or edge at the clock input, eight bits will be input at the LVDS input until the next clock pulse. This is a reason why the LVDS data rate is 8× the input clock frequency for this embodiment. As discussed above, M can be any value. The frame will have M bits and the LVDS data rate will be M times faster than the clock input. There will be M bits for each shift register. Therefore, in this embodiment, there will be eight bits or eight rows for each shift register A1 to A4. Each row of shift registers will be connected to a multiplexer 719 for that row. The multiplexer can be implemented using circuitry that performs the multiplexer function, which can include logic gates or pass transistors, or both. And, an output of each register will be connected to the input of a register B. There will be eight bits for register B, one for each row of shift registers A1 to A4. After eight bits of data are loaded in a shift register A1 to A4, an appropriate selected shift register A is parallel loaded through the multiplexer into register B. In other embodiments, there may be more than eight bits in a data frame, or less than eight bits. For example, a frame may contain 16 bits. Then, there would be 16 bits per shift register.

In the case M is programmably selectable by the user, the number of bits per shift register will be the maximum value for M. For example, if M can be 4, 7, or 8, each shift register will hold at least 8 bits. In the case M can be programmably selected to be 2, 3, 4, 5, 6, 7, 8, 9, or 10, then each shift register will hold at least 10 bits.

The load signal is at the same frequency as the 1× input clock, but has a different phase and different duty cycle from the input clock. The load signal is used to load data into register B. So, the load signal needs to be asserted after allowing for sufficient time for the data to be ready at its input.

Using the circuitry of the present invention, a proper clock strobe can be selected at the appropriate clocking points in the LVDS input stream to ensure the correct data is latched in. The circuitry tries to guess which way the input clock is skewed and then compensates for this skew.

A technique of the present invention is during a calibration or training period for the integrated circuit, the user inputs a predetermined pattern of LVDS input bits. For example, the training bits may be 00001111. The circuitry then determines which of the multiple clocks strobes catches the correct pattern. If only one clock correctly resolves the data, then that particular clock strobe is selected. To select this clock strobe, the appropriate selection bits are will be stored in to a selection register (written select logic 731) or storage cells connected to a selection input of multiplexer 734. Select control logic 731 includes the selection register to hold a selected input and as discussed above, also logic to determine which strobed data input to select. The select logic control circuitry is connected to outputs of registers A1, A2, A3, and A4. The control circuitry checks the contents of the first, second, third, and fourth shift register during the training period to determine which shift registers have latched the correct data. The control circuitry then decides to select one of the shift registers, which will be connected to register B using the multiplexer. For example, if three clock strobes catch the correct data, then the middle clock strobe (between the first and last clock strobes catching the correct data) is selected for use. If four clock strobes catch the correct data, then one of the two middle clock strobes (between the first and last clock strobes catching the correct data) is selected. If two clock strobes catch the correct data, then one of the two clock strobes is selected. The LVDS input of this integrated circuit will now be calibrated and the user can begin using the integrated circuit in normal operation and send real data to the LVDS input. Select logic 751 circuitry is used to perform this function.

The particular embodiment described above oversamples using four clocks. However, in other embodiments of the invention, other numbers of clocks may be used and the appropriate changes can be made to the circuitry. There may be fewer than four clock strobes, such as two or three clocks. Other embodiments may include more than four clock strobes. For example, there may be five, six, seven, eight, or more clock strobes. If there are more clocks, this can also be used to increase the skew coverage to more than a single clock cycle. Therefore, the circuitry will be able to compensate for skew of greater than one clock cycle. The circuitry will be modified to generate the desired number of clock strobes and store the resulting data samples. For example, for five clock strobes, there would be five shift registers.

Figure 9:
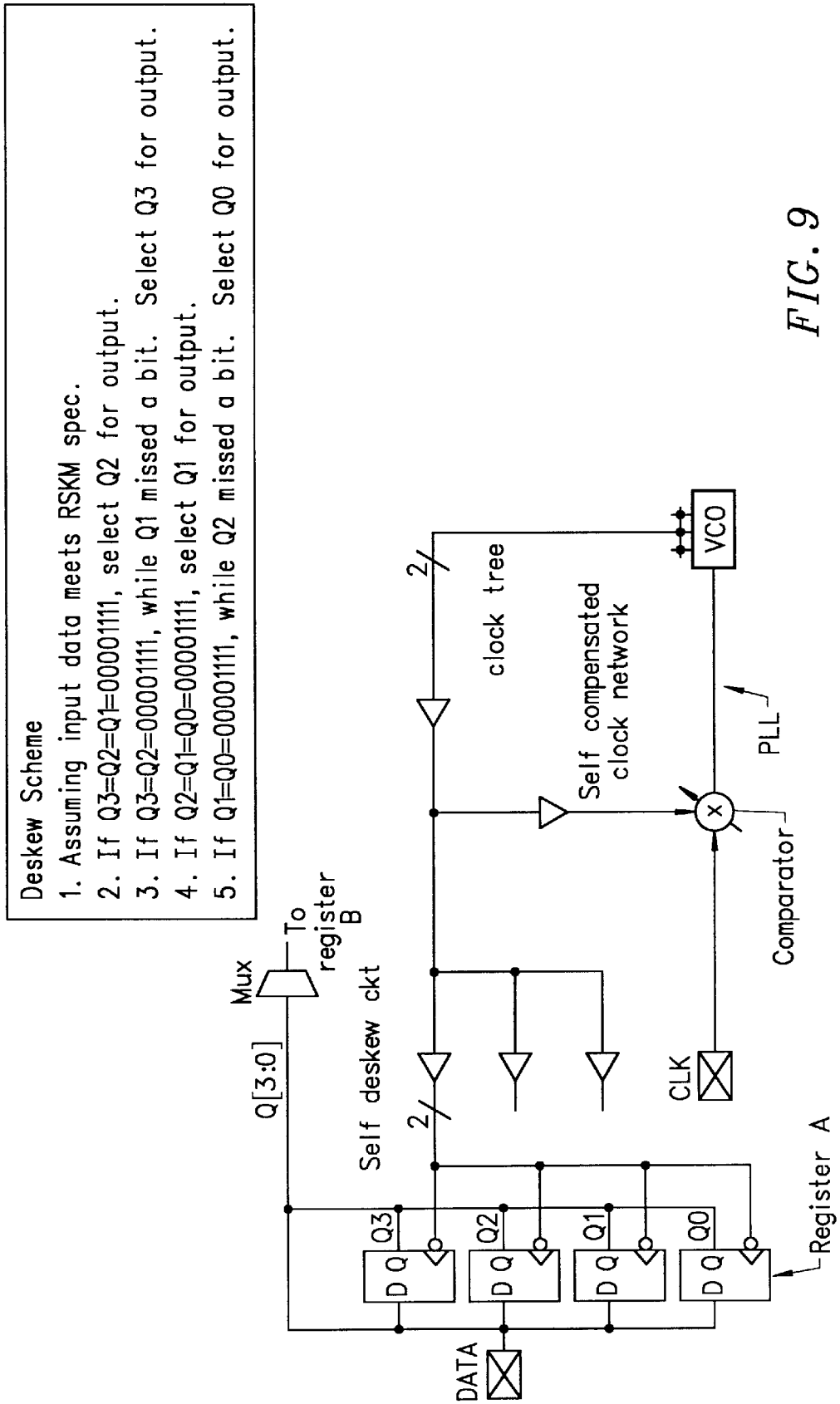
FIG. 9 shows an embodiment for deskewing a high frequency serial input and a clock input using two clocks generated from a PLL.

FIG. 9 shows another embodiment of the deskew scheme of the present invention. In this embodiment, the four clocks Q0, Q1, Q2, and Q3 are generated using by the PLL (includes a voltage controlled oscillator (VCO) and self-compensated clock network). In the self-compensated clock network, the clock generated by the VCO is fed back and combined with the input clock to regulate the VCO. The PLL generates two different clocks having the same frequency but different phase. These two clocks will be two of the clocks Q0 to Q3. These two clocks are inverted to generate the remaining two clocks of clocks Q0 to Q3.

The calibration bit stream is a fixed pattern, for example 00001111. The PLL sends two clock signals with a skew of 0.66 nanoseconds. Two of the four data registers are negative edge trigger for the desired clock skew. In this embodiment, if Q3, Q2, and Q1 catch the correct input data, then Q2 is selected for output to register B. If Q3 and Q2 catch the correct input data, while Q1 misses a bit, select Q3 for output. If Q2, Q1, and Q0 catch the correct input data, select Q1 for output. If Q1 and Q0 catch the correct input data, while Q2 misses a bit, select Q0 for output.

Figure 10:
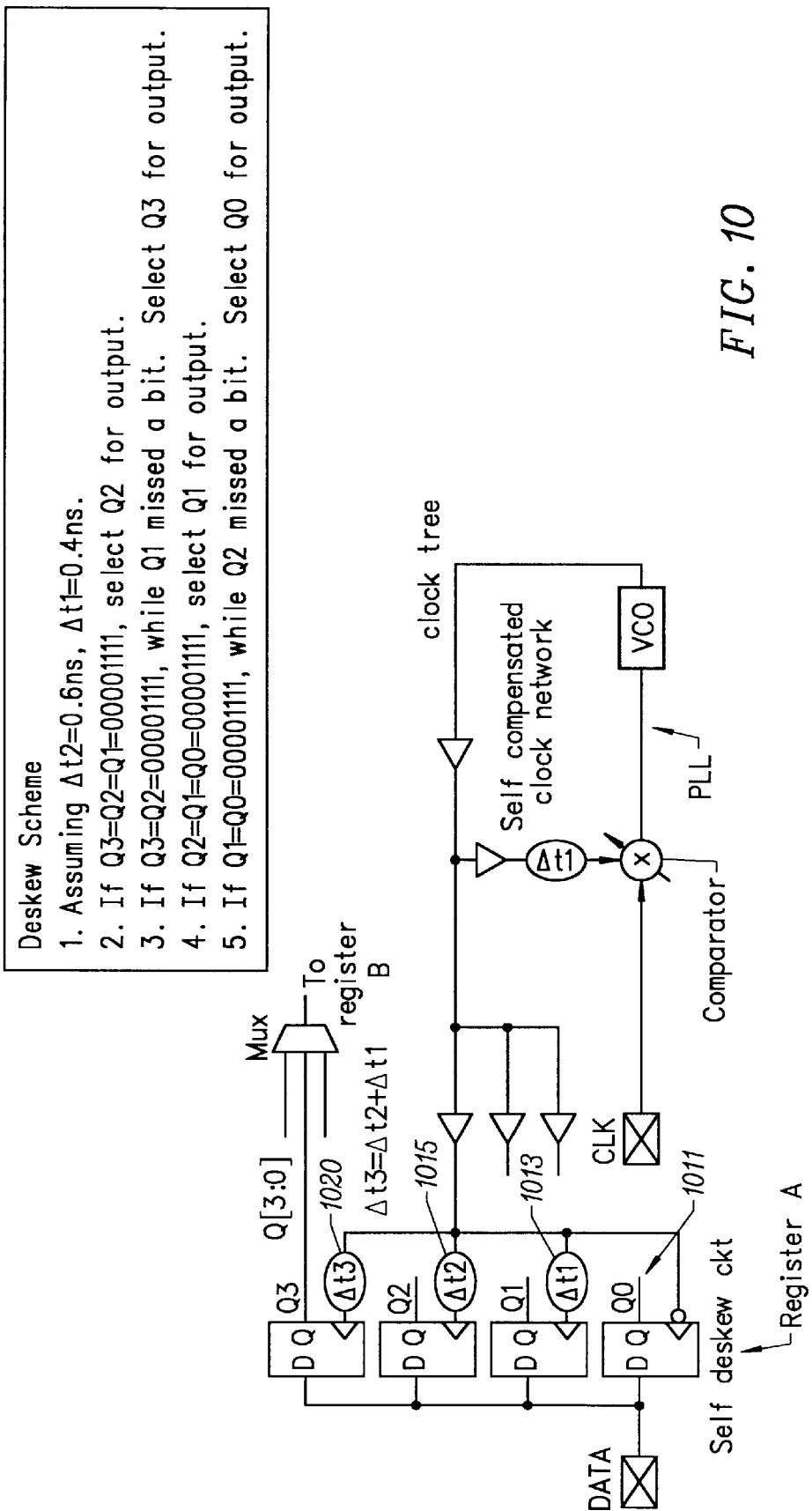
FIG. 10 shows another embodiment for deskewing a high frequency serial input and a clock input using one clock generated from a PLL.

FIG. 10 shows an alternative implementation of the deskew circuitry using a delay chain. The PLL generates a single clock output. Each data register has a local delay chain to skew the clock, for example, 0.66 nanoseconds and 0.44 nanoseconds. One register A has no delay 1011. Other registers have delays of t1 1013, t2 1015, and t3 1020. In a specific embodiment, there is about a 0.3 nanosecond delay between the clocks for each of the registers. A similar deskew scheme as described for FIG. 9 and described above applies.

In comparison to the embodiment in FIG. 9, the FIG. 10 embodiment is easier to implement because the PLL only needs to generate one clock signal instead of two. However, the strobe placement accuracy is dependent on the characteristics of the delay chains. The time delays between one clock strobe to the next may be constructed using logic gates, capacitances, and impedances. For example, a variable impedance and capacitance structure (essentially an RC delay circuit) may be used to create the time delays.

Figure 11:
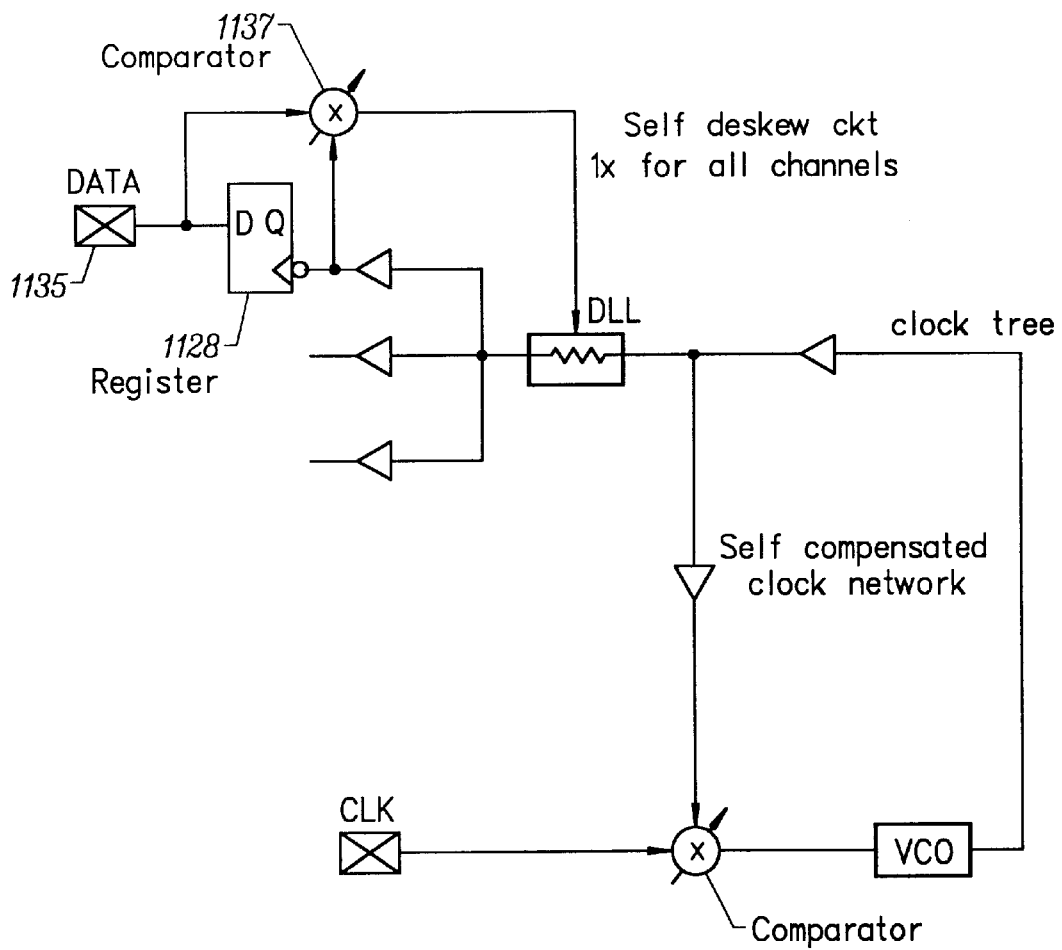
FIG. 11 shows an input interface to deskew a high frequency serial input and a clock input suing a DLL.

FIG. 11 shows another implementation using delay locked loop (DLL). The data input and clock can be XORed for generating a phase error, which determines the amount of delay. A very precise timing adjustment can be achieved, but the DLL must respond within one half of the clock period, and before clock falling edge arrives. Each LVDS channel has a register 1128. The LVDS data input 1137 is input to a comparator 1137. Also input to comparator 1137 is the clock input to the register. The comparator or phase detector compares the data and rising edge of the clock of the input register. The DLL adjusts the clock edge dynamically. The DLL can be varied to follow the data. In an embodiment, the DLL delays the clock based on the data. The data is captured at falling edge clock. Dynamic tracking of data input good for higher frequency LVDS data rates. But each channel or LVDS input needs a DLL circuit, which takes space. This approach is sometimes referred to as a clock data recovery (CDR) scheme. Using CDR, the clock frequency and phase are generated based on the data frequency and phase.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A programmable logic integrated circuit comprising:
   a first register coupled to a first input and a first clock signal;
   a second register coupled to the first input and a second clock signal;
   a multiplexer coupled to outputs of the first and second registers; and
   a third register coupled to an output of the multiplexer and a third clock signal, wherein
   the first and second clock signals are at a first frequency and have different phases,
   the third clock signal is at a second frequency, slower than the first frequency, and a data rate of data appearing at the first input is at about the first frequency.

2. The programmable logic integrated circuit of claim 1 wherein the first frequency is at least twice the second frequency.

3. The programmable logic integrated circuit of claim 1 wherein the first and second clock signals are generated using an on-chip phase locked loop circuit.

4. The programmable logic integrated circuit of claim 1 wherein the first register is part of a first shift register and the second register is part of a second shift register.

5. The programmable logic integrated circuit of claim 1 wherein a selection input of the multiplexer is coupled to a selection register to selectively couple the first or second register to the third register.

6. The programmable logic integrated circuit of claim 5 further comprising:
   selection control logic circuitry, coupled to the first and second register and generating an output coupled to the selection register.

7. The programmable logic integrated circuit of claim 1 wherein the first clock signal is programmably selectable to be M times faster than the third clock signal, where M is at least 2.

8. The programmable logic integrated circuit of claim 1 further comprising:
   a fourth register coupled to the first input, a fourth clock signal, and the multiplexer; and
   a fifth register coupled to the first input, a fifth clock signal, and the multiplexer, wherein the fourth and fifth clock signals are at the first frequency, and the first, second, fourth, and fifth clock signals each have different phases.

9. An integrated circuit comprising:
   a high frequency differential data input;
   a clock input, wherein a data rate at the data input is at least M times a frequency of a clock signal provided at the clock input, wherein M is an integer 2 or greater;
   a differential input buffer coupled to the high frequency data input outputting a single-ended data input;
   a clock generator circuit coupled to the clock input and generating a first fast clock signal that is at least M times the clock input;
   a first shift register and second shift register coupled to receive serial data from the single-ended data input, wherein the first and second shift registers are clocked using two clock signals having a frequency of the first fast clock signal, but different phases;
   a plurality of multiplexers, one for each bit of the first and second shift registers, wherein each multiplexer is coupled to one bit in the first shift register and one bit in the second shift register; and
   a third register coupled to the multiplexers.

10. The integrated circuit of claim 9 wherein the first shift register, second shift register, and third register each have eight bits.

11. The integrated circuit of claim 9 wherein the third register is loaded using a load signal at a frequency of the clock input.

12. The integrated circuit of claim 9 wherein the third register is loaded in parallel with the data from the first or second shift register, selected using the multiplexers.

13. The integrated circuit of claim 9 wherein the data from the third register is used to drive programmable interconnect lines of the integrated circuit.

14. A method of operating a programmable logic integrated circuit comprising:
   inputting a predetermined stream of bits at a high frequency input;
   inputting a clock signal at a clock input;
   from the clock signal, generating a first and a second fast clock signal, each having the same frequency but different phase, and the predetermined stream has a frequency of about the first fast clock signal;
   loading the predetermined stream in a first shift register using the first fast clock signal;
   loading the predetermined stream in a second shift register using the second fast clock signal; and selectively passing data from the first or second shift register to a third register.

15. The method of claim 14 wherein the first and second fast clock signals are generated using a phase locked loop circuit.

16. The method of claim 14 further comprising:
   converting from a differential input at the high frequency input to a single-ended input.

17. The method of claim 14 further comprising:
   programmably selecting a frequency of the first fast clock signal to be M times faster than the clock signal, wherein M is 2 or greater.

18. The method of claim 14 further comprising:
   loading the predetermined stream in a fourth shift register using a falling edge of the first fast clock signal; and
   loading the predetermined stream in a fifth shift register using a falling edge of the second fast clock signal.

19. The method of claim 14 wherein the second fast clock signal is generated by delaying the first fast clock signal.

20. The method of claim 19 further comprising:
   loading the predetermined stream in a fourth shift register using a third fast clock signal, generated by delaying the second fast clock signal; and
   loading the predetermined stream in a fifth shift register using a fourth fast clock signal, generated by delaying the third fast clock signal.

* * * * *